US011781925B2

(12) United States Patent
Kinjo

(10) Patent No.: US 11,781,925 B2
(45) Date of Patent: Oct. 10, 2023

(54) FORCE SENSOR INCLUDING MULTIPLE ARRAY SUBSTRATES

(71) Applicant: Japan Display Inc., Tokyo (JP)

(72) Inventor: Hiroumi Kinjo, Minato-ku (JP)

(73) Assignee: Japan Display Inc., Tokyo (JP)

( * ) Notice: Subject to any disclaimer, the term of this patent is extended or adjusted under 35 U.S.C. 154(b) by 45 days.

(21) Appl. No.: 17/467,757

(22) Filed: Sep. 7, 2021

(65) Prior Publication Data

US 2022/0082457 A1    Mar. 17, 2022

(30) Foreign Application Priority Data

Sep. 16, 2020   (JP) .................................. 2020-155746

(51) Int. Cl.
*G01L 1/14*    (2006.01)
*H01L 25/065*   (2023.01)

(52) U.S. Cl.
CPC .......... *G01L 1/146* (2013.01); *H01L 25/0655* (2013.01)

(58) Field of Classification Search
CPC ......... B81B 3/0078; B81B 3/007; G01L 1/16; G01L 1/146; G01L 1/205; G01L 1/14
See application file for complete search history.

(56) References Cited

U.S. PATENT DOCUMENTS

| | | | | |
|---|---|---|---|---|
| 4,836,033 A | * | 6/1989 | Seitz ....................... | G01L 1/146 361/291 |
| 5,373,181 A | * | 12/1994 | Scheiter ............. | G06V 40/1306 257/415 |
| 5,942,733 A | * | 8/1999 | Allen ...................... | G06V 40/20 178/19.03 |
| 6,556,418 B2 | * | 4/2003 | Aigner .................. | G01L 9/0042 361/283.4 |
| 7,021,158 B2 | * | 4/2006 | Shimizu ............. | G06V 40/1306 73/862.041 |
| 7,059,203 B2 | * | 6/2006 | Asai .......................... | G01L 1/20 73/862.046 |
| 7,080,562 B2 | * | 7/2006 | Knowles .................. | G01N 3/12 73/818 |
| 7,258,026 B2 | * | 8/2007 | Papakostas ............... | G01L 1/20 73/862.041 |

(Continued)

FOREIGN PATENT DOCUMENTS

JP          6-281516 A    10/1994

*Primary Examiner* — Tran M. Tran
(74) *Attorney, Agent, or Firm* — Maier & Maier, PLLC

(57) ABSTRACT

A force sensor including an array layer that includes array substrates arranged on an identical plane such that end portions thereof are adjacent to each other, the force sensor includes
  the array layer having a first surface on which array electrodes are disposed and a second surface opposite to the first surface;
  a conductive layer layered on the first surface of the array layer;
  a protection layer layered on the conductive layer; and
  a counter electrode interposed between the conductive layer and the protection layer, wherein
  a bonding member which bonds the adjacent array substrates and covers a joint between the adjacent array substrates is provided on the second surface of the array layer,
  the conductive layer is composed of a single member layered across each of the array substrates, and
  a sealing portion having a frame shape is provided on an outer circumference side of the conductive layer.

9 Claims, 13 Drawing Sheets

(56) References Cited

U.S. PATENT DOCUMENTS

| | | | | |
|---|---|---|---|---|
| 7,343,813 B1* | 3/2008 | Harrington | G01L 1/146 | |
| | | | 73/780 | |
| 8,336,399 B2* | 12/2012 | Murayama | G01L 5/228 | |
| | | | 73/862.046 | |
| 9,018,030 B2* | 4/2015 | Li | G06F 3/047 | |
| | | | 438/50 | |
| 9,347,838 B2* | 5/2016 | Chen | G01L 1/142 | |
| 9,383,881 B2* | 7/2016 | Day | G06F 3/0447 | |
| 9,459,734 B2* | 10/2016 | Day | G06F 3/0443 | |
| 9,690,408 B1* | 6/2017 | Krah | G06F 3/0412 | |
| 10,120,478 B2* | 11/2018 | Filiz | G06F 3/04166 | |
| 10,126,153 B2* | 11/2018 | Bischoff | G01L 1/16 | |
| 10,401,241 B2* | 9/2019 | Madden | G06F 3/04144 | |
| 10,423,265 B2* | 9/2019 | Filiz | G06F 3/0418 | |
| 10,442,091 B2* | 10/2019 | Kondoh | B25J 13/082 | |
| 10,545,058 B2* | 1/2020 | Bao | H01L 29/84 | |
| 10,585,540 B2* | 3/2020 | Teranishi | G06F 3/041662 | |
| 10,627,659 B2* | 4/2020 | Ochi | H04M 1/0266 | |
| 10,628,650 B2* | 4/2020 | Kurasawa | G06F 3/0448 | |
| 10,675,851 B2* | 6/2020 | Kawata | B32B 27/281 | |
| 10,729,067 B2* | 8/2020 | Hammer | G01L 9/0005 | |
| 11,093,088 B2* | 8/2021 | Bagheri | G06F 3/0445 | |
| 11,106,309 B1* | 8/2021 | Trapero Martin | G04G 21/08 | |
| 11,200,021 B2* | 12/2021 | Lee | G10K 9/122 | |
| 11,320,329 B2* | 5/2022 | Hagelin | G01L 1/205 | |
| 11,362,076 B2* | 6/2022 | Bibl | G04G 9/10 | |
| 11,415,471 B2* | 8/2022 | Finger | B60C 19/00 | |
| 11,493,392 B2* | 11/2022 | Kondoh | G01L 1/26 | |
| 11,534,929 B2* | 12/2022 | Natori | G01L 1/16 | |
| 2012/0228504 A1* | 9/2012 | Maeda | B81B 3/007 | |
| | | | 250/338.3 | |
| 2014/0178618 A1* | 6/2014 | Tanabe | G06F 1/1601 | |
| | | | 428/38 | |
| 2016/0034073 A1* | 2/2016 | Andoh | G06F 3/04144 | |
| | | | 345/174 | |
| 2016/0077649 A1* | 3/2016 | Ando | G02B 5/3025 | |
| | | | 345/174 | |
| 2016/0217664 A1* | 7/2016 | Bradford | H04Q 9/00 | |
| 2017/0160147 A1* | 6/2017 | Genmei | G01B 7/22 | |
| 2020/0003635 A1* | 1/2020 | Hirano | H01L 23/5383 | |
| 2020/0284666 A1* | 9/2020 | Takahashi | G01L 1/26 | |
| 2022/0049997 A1* | 2/2022 | Katsuhara | G01L 1/148 | |

* cited by examiner

FIG.6
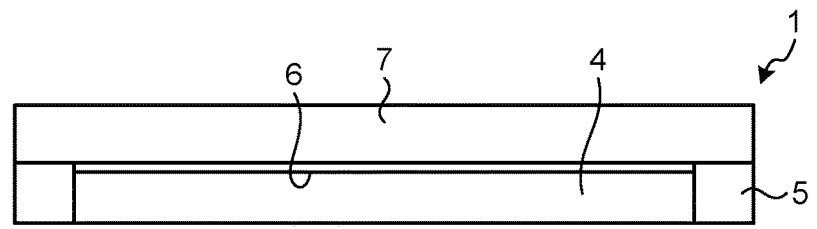
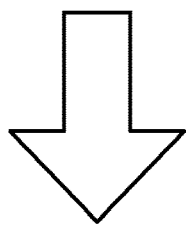
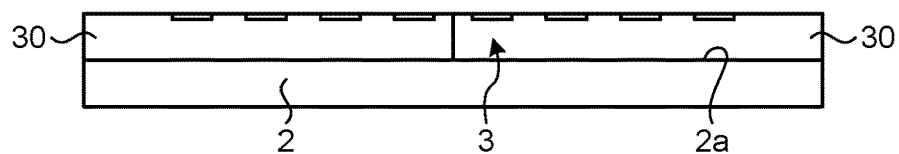
FIG.7
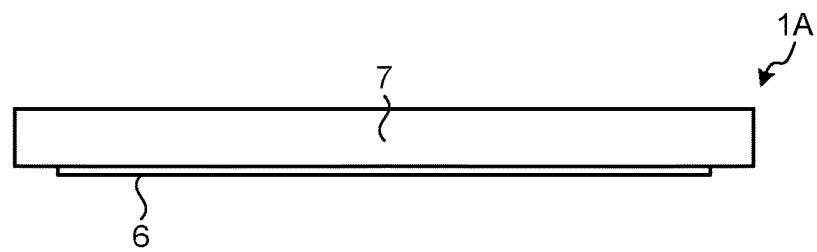
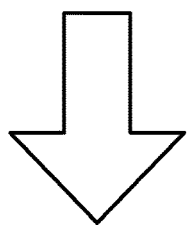
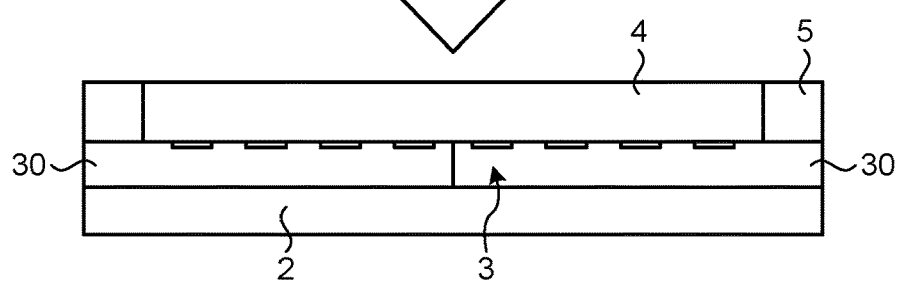

FORCE SENSOR INCLUDING MULTIPLE ARRAY SUBSTRATES

CROSS-REFERENCE TO RELATED APPLICATION

This application claims priority from Japanese Application No. 2020-155746, filed on Sep. 16, 2020, the contents of which are incorporated by reference herein in its entirety.

BACKGROUND

1. Technical Field

The present disclosure relates to a force sensor.

2. Description of the Related Art

The force sensor disclosed in Japanese Patent Application Laid-open Publication No. H06-281516 (JP-A-H06-281516) has a flexible substrate that has a large number of linear electrodes extending in only a Y direction and is attached to a front surface of a force sensitive conductive elastomer sheet, and another flexible substrate that has a large number of linear electrodes extending in only an X direction and is attached to a rear surface of the force sensitive conductive elastomer sheet. The force sensor disclosed in JP-A-H06-281516 uses a Y-direction multiplexer and an X-direction multiplexer to allow transmission and reception between the electrodes and a digital logic.

A force sensor is preferably provided with a frame-shaped sealing portion on its outer circumference to prevent infiltration of liquid.

It has been examined to manufacture a large-sized force sensor (hereinafter, called a large force sensor) by arranging multiple force sensors on an identical plane to be combined such that end portions of the force sensors are adjacent to each other. In the following description of the present disclosure, arranging multiple components on an identical plane such that end portions of the components are adjacent to each other is called tiling. As a result of such tiling, regions are formed in which the end portions (sealing portions) of the force sensors are adjacent to each other. The regions in which the sealing portions are adjacent to each other are positioned on an inner side from the end portion on the outer circumference side of the large force sensor, such as a central region of the large force sensor, for example. This causes reduction of a region capable of detecting force. On the other hand, the tiling using force sensors from which the sealing portions are removed may cause liquid to enter an inside of the force sensors.

SUMMARY

The present disclosure aims to provide a force sensor that is manufactured by tiling and can prevent entering of liquid while expanding a region capable of detecting force.

A force sensor, according to a first embodiment of the present disclosure, including an array layer that includes multiple array substrates arranged on an identical plane such that end portions of the array substrates are adjacent to each other, the force sensor includes: the array layer that has a first surface on which array electrodes are disposed and a second surface opposite to the first surface; a conductive layer that is layered on the first surface of the array layer; a protection layer that is layered on the conductive layer; and a counter electrode that is interposed between the conductive layer and the protection layer. A bonding member which bonds the adjacent array substrates and covers a joint between the adjacent array substrates is provided on the second surface of the array layer. The conductive layer is composed of a single member that is layered across each of the array substrates. A sealing portion that has a frame shape is provided on an outer circumference side of the conductive layer.

A force sensor, according to a second embodiment of the present disclosure, including an array layer that includes multiple array substrates arranged on an identical plane such that end portions of the array substrates are adjacent to each other, the force sensor comprising: the array layer that has a first surface on which array electrodes are disposed and a second surface opposite to the first surface; a conductive layer that is layered on the first surface of the array layer; a protection layer that is layered on the conductive layer; and a counter electrode that is interposed between the conductive layer and the protection layer. A bonding member which bonds the adjacent array substrates and covers a joint between the adjacent array substrates is provided on the second surface of the array layer. The conductive layer including multiple small piece conductive layers that are arranged on an identical plane such that end portions of the multiple small piece conductive layers are adjacent to each other. A sealing portion that has a frame shape is provided on an outer circumference side of the conductive layer.

BRIEF DESCRIPTION OF THE DRAWINGS

FIG. 6 is a diagram illustrating a part of a manufacturing process of the force sensor according to the first embodiment;

FIG. 7 is a diagram illustrating a part of the manufacturing process of a force sensor according to a second embodiment;

DETAILED DESCRIPTION

The following describes embodiments of a force sensor in the present disclosure in detail with reference to the accompanying drawings. The contents described in the following embodiments do not limit the present disclosure. The constituent elements described below include elements easily envisaged by those skilled in the art and identical elements. The constituent elements described below can be combined as appropriate. What is disclosed herein is made by way of examples. All appropriate modifications that may be easily achieved by those skilled in the art within the spirit of the invention are included in the scope of the present disclosure. To explain the drawings clearer, the widths, thicknesses, and shapes of components may be more schematically illustrated than the actual ones. Those are illustrated by way of examples and do not limit the interpretation of the present disclosure. In the present specification and the drawings, the same elements already described in the previous drawings are labeled with the same symbols and detailed description thereof may be omitted as appropriate.

First Embodiment

Figure 1:
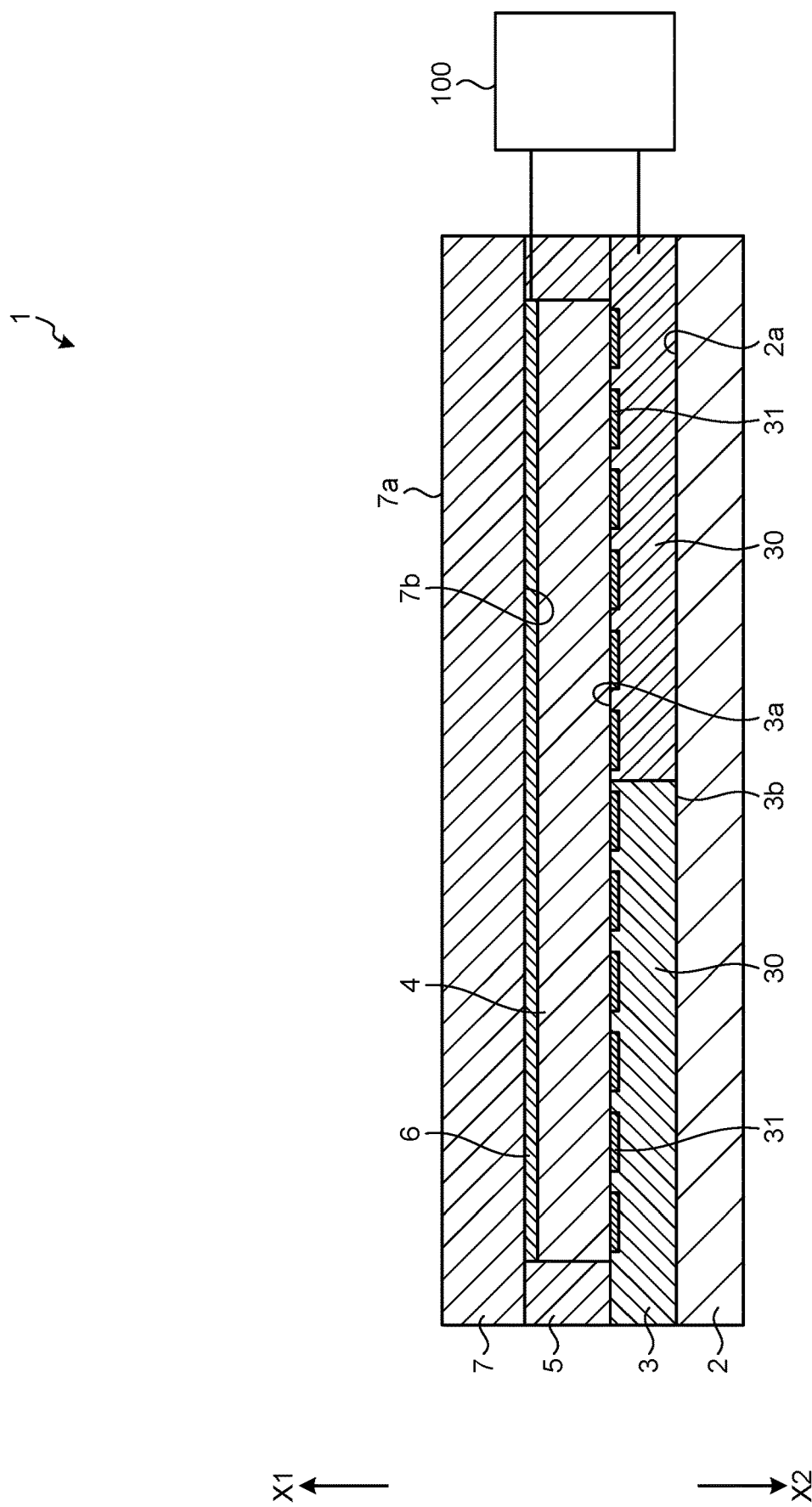
FIG. 1 is a cross-sectional view illustrating a cross-sectional structure of a force sensor according to a first embodiment.
Figure 2:
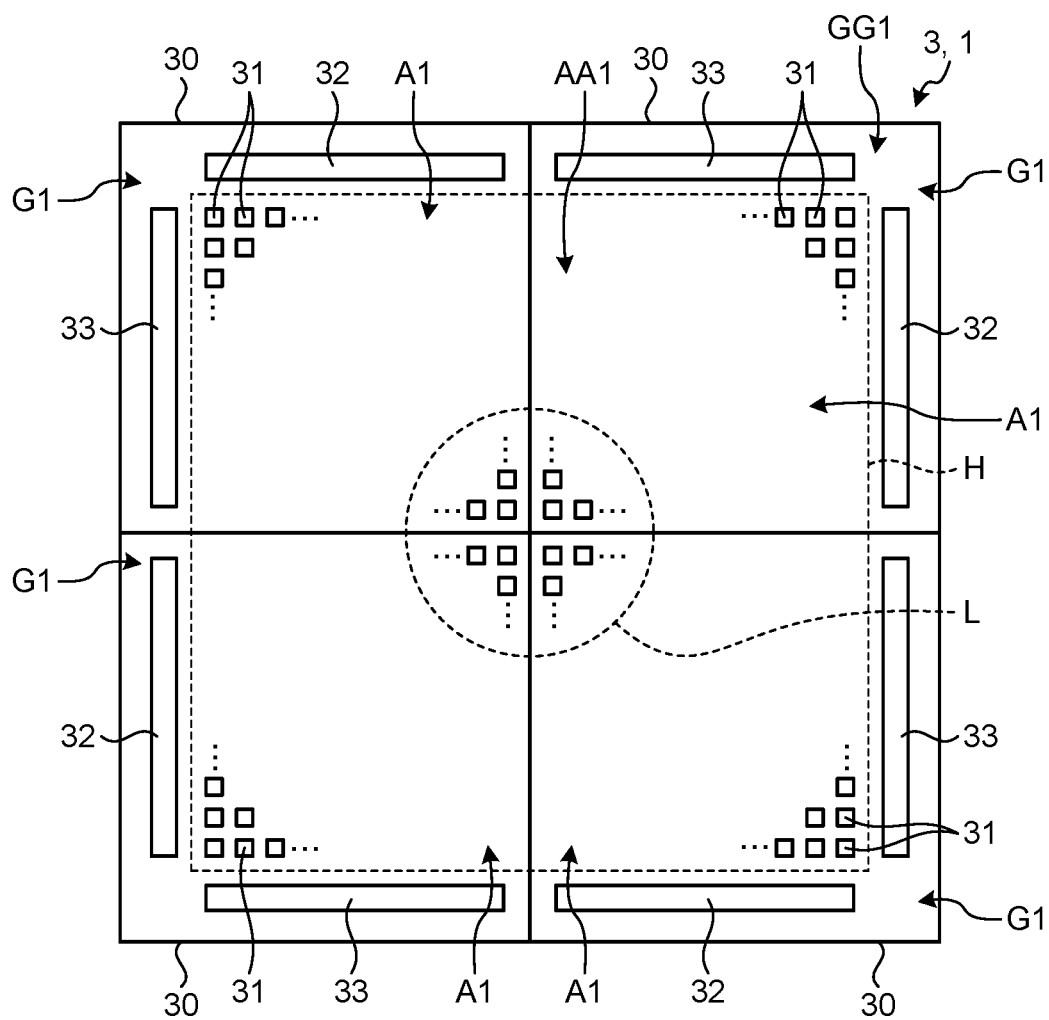
FIG. 2 is a plan view of an array layer according to the first embodiment when viewed from a conductive layer.
Figure 3:
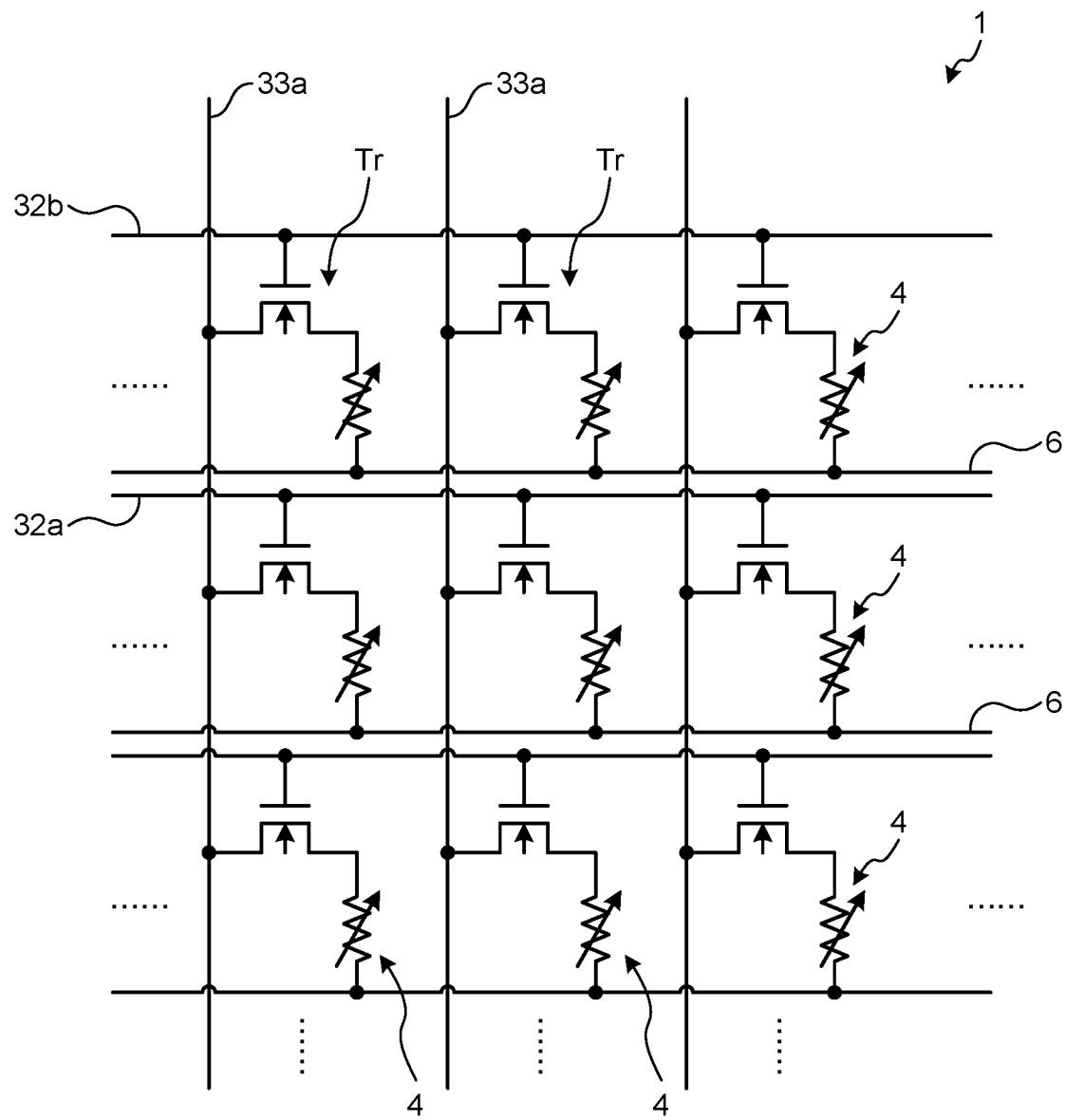
FIG. 3 is a circuit diagram describing a circuit structure provided on an array substrate according to the first embodiment.
Figure 4:
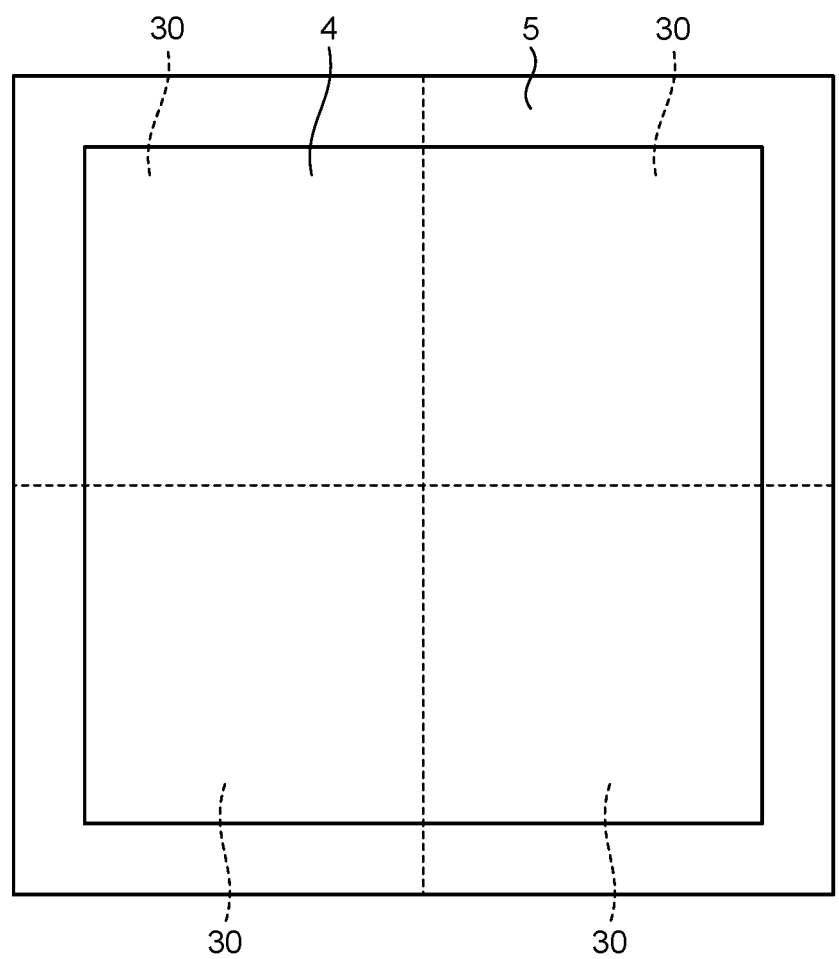
FIG. 4 is a plan view illustrating the conductive layer and a sealing portion according to the first embodiment when viewed from a protection layer.
Figure 5:
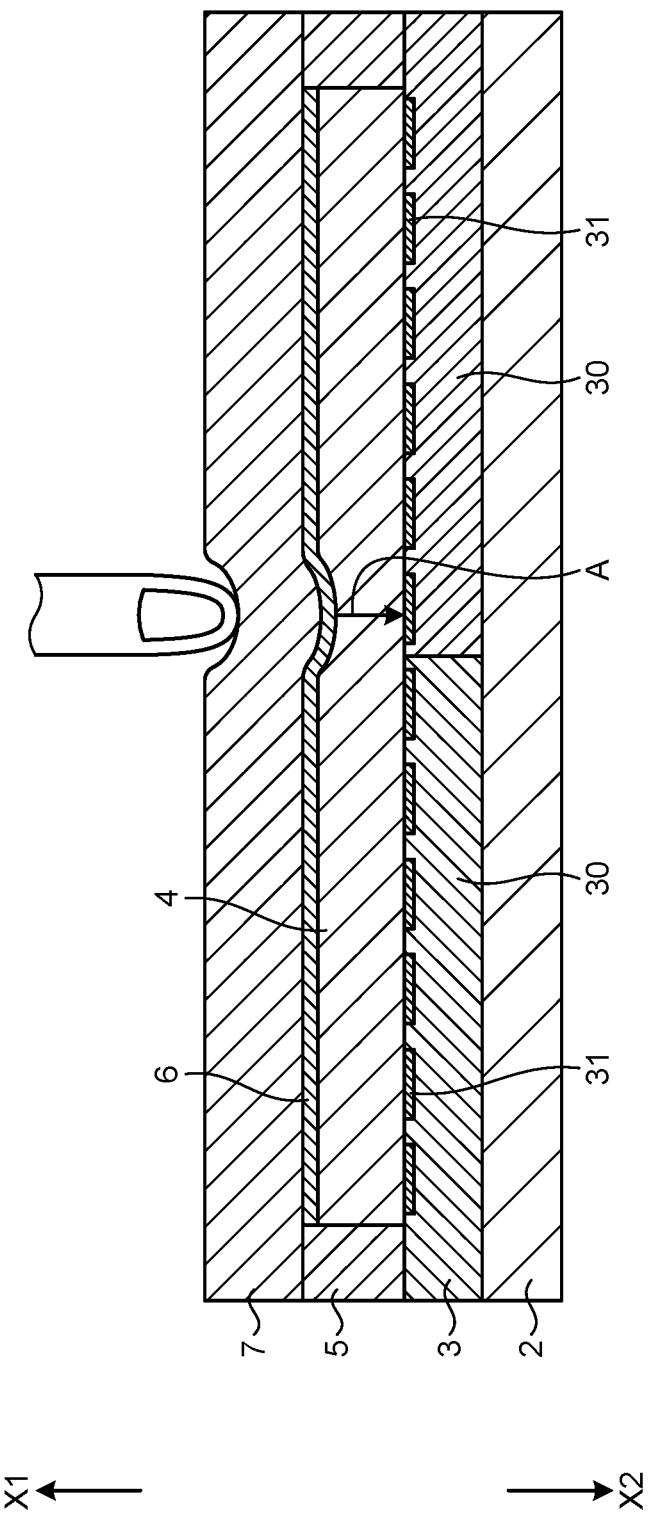
FIG. 5 is a cross-sectional view illustrating a use state of the force sensor according to the first embodiment.

FIG. 1 is a cross-sectional view illustrating a cross-sectional structure of a force sensor according to a first embodiment. FIG. 2 is a plan view of an array layer according to the first embodiment when viewed from a conductive layer. FIG. 3 is a circuit diagram describing a circuit structure provided on an array substrate according to the first embodiment. FIG. 4 is a plan view illustrating the conductive layer and a sealing portion according to the first embodiment when viewed from a protection layer. FIG. 5 is a cross-sectional view illustrating a use state of the force sensor according to the first embodiment. FIG. 6 is a diagram illustrating a part of a manufacturing process of the force sensor according to the first embodiment.

As illustrated in FIG. 1, a force sensor 1 according to the first embodiment includes a bonding member 2, an array layer 3, a conductive layer 4, a sealing portion 5, a counter electrode 6, and a protection layer 7. A controller 100 is coupled to the array layer 3 and the counter electrode 6 of the force sensor 1. In the force sensor 1, the bonding member 2, the array layer 3, the conductive layer 4, the counter electrode 6, and the protection layer 7 are layered in this order. The sealing portion 5 is in the same layer as the conductive layer 4. Hereinafter, the direction in which the constituents of the force sensor 1 are layered is described as a layering direction for convenience of explanation. The direction in which the protection layer 7 is disposed when viewed from the conductive layer 4 is defined as a first direction X1. The direction in which the array layer 3 is disposed when viewed from the conductive layer 4 is defined as a second direction X2. The conductive layer 4 is sometimes called a sensor layer.

The array layer 3 has a first surface 3a facing in the first direction X1 and a second surface 3b facing in the second direction X2. As illustrated in FIG. 2, the array layer 3 has a detection region AA1 having a quadrilateral shape when viewed from the layering direction and a non-detection region GG1 having a quadrilateral frame shape surrounding the detection region AA1. The detection region AA1 is a region in which force is detected. The array layer 3 has multiple array substrates 30 that are arranged by the tiling.

The array substrate 30 is an insulating substrate having a quadrilateral shape when viewed from the layering direction. The array substrate 30 has a detection region A1 and a non-detection region G1 (refer to a border line H between the detection region A1 and the non-detection region G1 in FIG. 2). The non-detection region G1 extends along the end portion of the array substrate 30 and has an L-shape. Multiple array electrodes 31 having a square shape are arranged in a matrix (a row-column configuration) in the detection region A1.

Four array substrates 30 are arranged on an identical plane such that the end portions of the array substrates 30 are adjacent to each other. The four array substrates are arranged such that the non-detection regions G1 continue to form a frame shape. As a result, the array layer 3 has the detection region AA1 composed of combination of four detection regions A1 and the non-detection region GG1 composed of combination of four non-detection regions G1.

As illustrated in FIG. 3, the array substrate 30 includes multiple transistors Tr, gate lines 32a each coupled to a gate electrode of the transistor Tr and signal detection lines 33a each coupled to a source electrode of the transistor Tr. The array electrodes 31 are each coupled to a drain electrode of the transistor Tr.

As illustrated in FIG. 2, the non-detection region G1 is provided with a gate driver 32 that is coupled to the gate lines 32a and a selector 33 that is coupled to the signal detection lines 33a. The gate driver 32 is a circuit that drives the gate lines 32a based on a control signal from the controller 100. The gate driver 32 selects the gate lines 32a sequentially or simultaneously and supplies a gate drive signal to the selected gate line 32a. The selector 33 selects one or multiple of the signal detection lines 33a coupled to the controller 100 out of the signal detection lines 33a based on a control signal from the controller 100, and outputs a signal input into the signal detection lines 33a to the controller 100.

As illustrated in FIG. 1, the bonding member 2 bonds the four array substrates 30. The bonding member 2 in the embodiment is a (single) film member or sheet member having the same shape as the array layer 3 when viewed from the layering direction. The bonding member 2 has a first surface 2a facing in the first direction X1. The first surface 2a of the bonding member 2 is overlapped with the second surface 3b of the array layer 3 and covers the whole of the second surface 3b of the array layer 3. An adhesive is applied to the first surface 2a of the bonding member 2, resulting in the whole of the first surface 2a of the bonding member 2 and the whole of the second surface 3b of the array layer 3 being adhesively bonded. As a result, the four array substrates 30 are fixed to the bonding member 2 and supported by the bonding member 2 such that the four array substrates 30 are not separated from each other. In addition, the bonding member 2 covers joints (portions at which the end portions of the array substrates 30 abut on each other) of the four array substrates 30. This structure prevents liquid that is present on the second direction X2 side of the bonding member 2 from entering the joints of the four array substrates 30. In the example illustrated in FIG. 2, the number of array substrates 30 is four. Four or more of the array substrates 30 may be bonded by the single bonding member 2.

The conductive layer 4 is formed in the same shape as the detection region AA1 (refer to FIG. 2) of the array layer 3 when viewed from the layering direction. The conductive layer 4 is made of a single member and layered on and across each of the array substrates 30. This structure allows the detection region AA1 of the array layer 3 to detect force in its enter region. The conductive layer 4 uses, as a row material, a force sensitive conductive elastomer including a rubber material that has a high insulation property and serves as a mother material and conductive fine particles dispersed in the mother material, for example. The conductive fine particles disposed in the mother material are separated from one another. The conductive layer 4, thus, demonstrates a very high resistance value and has an insulation property both in thickness direction and surface direction at a normal time (in a case where the conductive layer 4 is not deformed). On the other hand, when the conductive layer 4 is depressed and the mother material at a depressed portion is compressed in the layering direction, the conductive fine particles included in the mother material at the deformed portion are in contact with one another. As a result, the conductive layer 4 has conductivity in the layering direction (thickness direction). The conductive layer 4 according to the first embodiment is formed of a force sensitive material having a resistance value that changes in accordance with force applied from the thickness direction. The material used for the conductive layer 4 is not limited to the force sensitive conductive elastomer. Any material can be used that has a resistance value changing in accordance with force applied from the thickness direction.

The conductive layer 4 is adhesively bonded to the array layer 3. For example, when the conductive layer 4 is adhesively bonded to the array layer 3 with a double-sided adhesive tape, the double-sided adhesive tape is manufactured of an anisotropic conductive material that has conductivity in the thickness direction (layering direction) and an insulation property in the surface direction. More specifically, the double-sided adhesive tape includes a resin or rubber that has an insulation property and serves as a mother material and conductive fine particles dispersed in the mother material. The conductive fine particles are in contact with both the conductive layer 4 and the array electrodes 31 and disposed in the mother material in such a manner not to be in contact with one another in the mother material. The double-sided adhesive tape is an example. Instead of using the double-sided adhesive tape, the conductive layer 4 may be bonded using a molten resin, or the conductive layer 4 itself may be made adhesive. When a resin is used, examples of the resin include photo-curable resins and thermosetting resins in which conductive fine particles are dispersed.

As illustrated in FIG. 4, the sealing portion 5 is formed by hardening a resin having an insulation property. The sealing portion 5 surrounds the outer circumference side of the conductive layer 4 continuously in the peripheral direction to form a quadrilateral frame shape. The sealing portion 5 overlaps with the non-detection region GG1 when viewed from the layering direction. As illustrated in FIG. 1, the sealing portion 5 is interposed between the protection layer 7 disposed in the first direction X1 and the array layer 3 disposed in the second direction X2 while being in contact with (abutting on) both protection layer 7 and array layer 3. This structure, thus, prevents liquid that is present on the side of the force sensor 1 from passing through between the sealing portion 5 and the protection layer 7 and/or between the sealing portion 5 and the array layer 3 to enter toward the conductive layer 4.

The protection layer 7 is a film member or a sheet member formed in the same shape as the array layer 3 when viewed from the layering direction. A first surface 7a of the protection layer 7 is depressed by a finger or a pen. The counter electrode 6 is formed on a second surface 7b of the protection layer 7. The protection layer 7 is manufactured of rubber or a resin having a high insulation property and low rigidity. The protection layer 7 is deformed when the first surface 7a is depressed (refer to FIG. 5).

The counter electrode 6 is an electrode patterned on the second surface 7b of the protection layer 7. The counter electrode 6 is a solid electrode having the same shape as the conductive layer 4 when viewed from the layering direction. The counter electrode 6 is adhesively bonded to the conductive layer 4. For example, when the counter electrode 6 is adhesively bonded with a double-sided adhesive tape, the double-sided adhesive tape is manufactured of an anisotropic conductive material that has conductivity in the thickness direction (layering direction) and an insulation property in the surface direction.

The controller 100 applies a reference voltage to the counter electrode 6 when force is detected. In the example illustrated, the controller 100 transmits control signals to the gate driver 32 and the selector 33 of each of the four array substrates 30. The controller 100 measures a deformed portion (coordinates) by being depressed of the conductive layer 4 and the depressing force (force) from a detection signal received via the signal detection lines 33a and selector 33.

The following describes an operation example of the force sensor 1. When the first surface 7a of the protection layer 7 is not depressed, the thickness of the conductive layer 4 is not reduced. The conductive layer 4 has an insulation property in the thickness direction and no current (signal) flows from the counter electrode 6 to the conductive layer 4.

As illustrated in FIG. 5, when the first surface 7a of the protection layer 7 is depressed by the finger in the second direction X2, the conductive layer 4, the counter electrode 6, and the protection layer 7 are recessed in the second direction X2. As a result, the resistance value of the deformed portion recessed in the second direction X2 of the conductive layer 4 is reduced. Consequently, a current flows from the counter electrode 6 to the deformed portion of the conductive layer 4 (refer to arrow A in FIG. 5). The controller 100 detects that the signal (current) is input into the array electrodes 31 and can calculate the depressed portion (coordinates) and the force value.

When a central portion of the detection region AA1 (a range surrounded with broken line L in FIG. 2) is depressed by a finger, the force sensor 1 in the first embodiment can detect force at the depressed portion since the range overlaps with the detection regions A1 of the array substrates 30. The force sensor 1 can detect force even at a portion where the end portions of the array substrate 30 arranged by tiling are adjacent to each other.

The following describes a manufacturing method of the force sensor 1. First, the four array substrates 30 are adhesively bonded to the first surface 2a of the bonding member 2. Then, the conductive layer 4 is adhesively bonded to the protection layer 7 on which the counter electrode 6 has been printed. Thereafter, a resin is applied around the conductive layer 4 and the resin is hardened, resulting in the sealing portion 5 being formed. Last, as illustrated in FIG. 6, the conductive layer 4 and the sealing portion 5 are adhesively bonded to the array layer 3.

The force sensor 1 according to the first embodiment expands the region capable of detecting force since the detection region AA1 and the sealing portion 5 are not overlapped in the layering direction. The bonding member 2 seals the joints between the array substrates 30 although the array substrates 30 are arranged by the tiling. The sealing portion 5 seals the outer circumference side of the conductive layer 4. As a result, this structure prevents liquid from entering toward the conductive layer 4.

The force sensor in the present disclosure is not limited to the force sensor 1 according to the first embodiment. For example, the force sensor in the present disclosure may be manufactured by different manufacturing methods from that described above. The following describes other embodiments. The description is made focusing on the difference from the force sensor 1 according to the first embodiment.

Second Embodiment

FIG. 7 is a diagram illustrating a part of the manufacturing process of a force sensor according to a second embodiment. As illustrated in FIG. 7, a force sensor 1A according to the second embodiment differs in manufacturing method from that of the force sensor 1 according to the first embodiment. Specifically, in the force sensor 1A according to the second embodiment, first, the four array substrates 30 are adhesively bonded to the first surface 2a of the bonding member 2 to manufacture the array layer 3. Then, the conductive layer 4 is adhesively bonded to the detection region AA1 (refer to FIG. 2) of the array layer 3 with a double-sided adhesive sheet. Thereafter, a resin is applied to the non-detection region GG1 (refer to FIG. 2) of the array layer 3 and the resin is hardened to form the sealing portion 5. Then, the protection layer 7 on which the counter electrode 6 has been printed is attached to the conductive layer 4 and the sealing portion 5. As a result, the protection layer 7 and the sealing portion 5 are adhesively bonded and the counter electrode 6 and the conductive layer 4 are adhesively bonded such that the counter electrode 6 and the conductive layer 4 can be conducted. The force sensor 1A thus structured can also has the same effect as the force sensor 1 according to the first embodiment.

Third Embodiment

Figure 8:
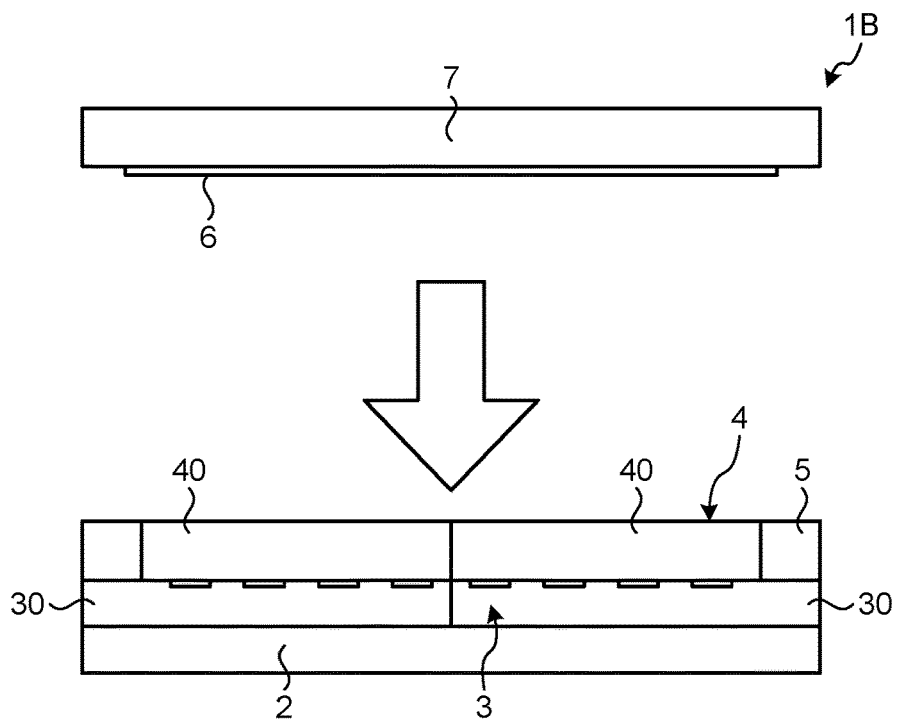
FIG. 8 is a diagram illustrating a part of the manufacturing process of a force sensor according to a third embodiment.

FIG. 8 is a diagram illustrating a part of the manufacturing process of a force sensor according to a third embodiment. As illustrated in FIG. 8, a force sensor 1B in the third embodiment differs from the force sensor 1 according to the first embodiment in that the conductive layer 4 includes multiple small piece conductive layers 40. The conductive layer 4 in the third embodiment includes the small piece conductive layers 40 that are arranged on an identical plane (on the first surface 3a of the array layer 3) such that the end portions of the small piece conductive layers 40 are adjacent to each other. The sealing portion 5 surrounds the outer circumference side of the conductive layer 4 including the small piece conductive layers 40. The sealing portion 5 is present on the outer circumference side of the conductive layer 4 but is absent on the joints between the small piece conductive layers 40. When the small piece conductive layers 40 are used, the conductive layer 4 may be manufactured by adhesively bonding the small piece conductive layer 40 to each array substrate 30. Thereafter, the protection layer 7 on which the counter electrode 6 has been printed may be attached.

Alternatively, the small piece conductive layers 40 may be adhesively bonded to the counter electrode 6 having been printed on the protection layer 7 and thereafter the small piece conductive layers 40 may be adhesively bonded to the array layer 3, which is not illustrated.

Fourth Embodiment

Figure 9:
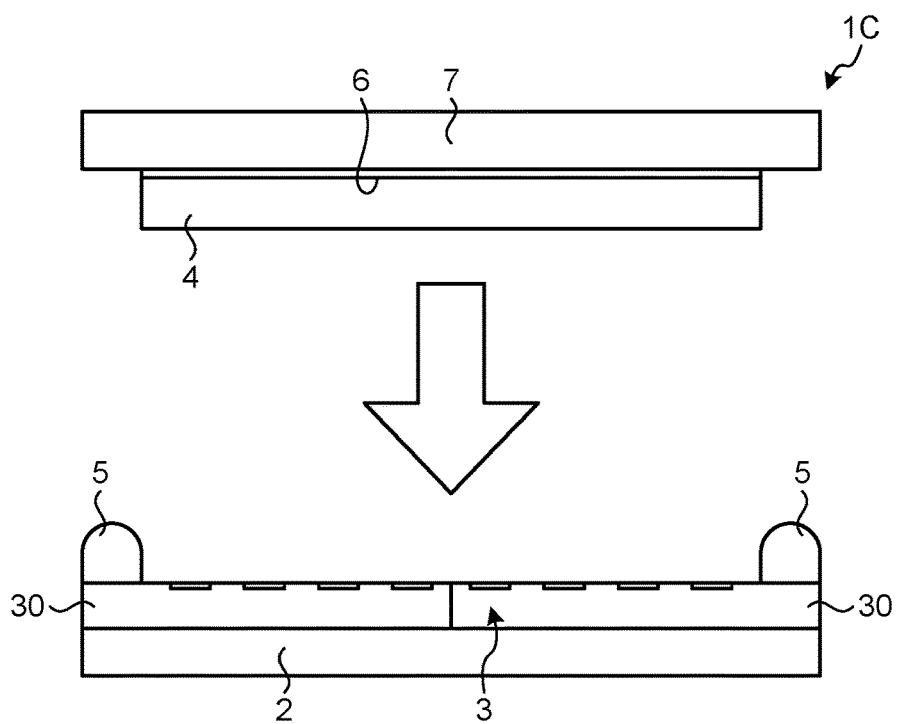
FIG. 9 is a diagram illustrating a part of the manufacturing process of a force sensor according to a fourth embodiment.

FIG. 9 is a diagram illustrating a part of the manufacturing process of a force sensor according to a fourth embodiment. A force sensor 1C according to the fourth embodiment differs from the force sensor according to the first embodiment in that the resin used for forming the sealing portion 5 is brought in contact with the protection layer 7 before the resin is hardened. Specifically, the resin is applied to the non-detection region GG1 (refer to FIG. 2) of the array layer 3 having been adhesively bonded to the bonding member 2. Before the resin is hardened, the conductive layer 4 and the protection layer 7 are overlapped with the array layer 3 and the applied resin, thereby causing the resin to be in contact with a peripheral portion of the protection layer 7. The detection region AA1 of the array layer 3 and the conductive layer 4 are adhesively bonded with a double-sided adhesive tape, which is not illustrated. Then, the resin is hardened. As a result, the sealing portion 5 is fixed to both non-detection region GG1 of the array layer 3 and protection layer 7, thereby achieving a high sealing property. The resin forming the sealing portion 5 may be applied to the peripheral portion of the protection layer 7 and thereafter may be brought in contact with the array layer 3 before being hardened.

The sealing portion 5 of each of the force sensors 1, 1A, 1B, and 1C according to the first to the fourth embodiments is disposed in such a manner to be sandwiched between the array layer 3 and the protection layer 7. The force sensor in the present disclosure is not limited to those embodiments. The following describes the details thereof.

Fifth Embodiment

Figure 10:
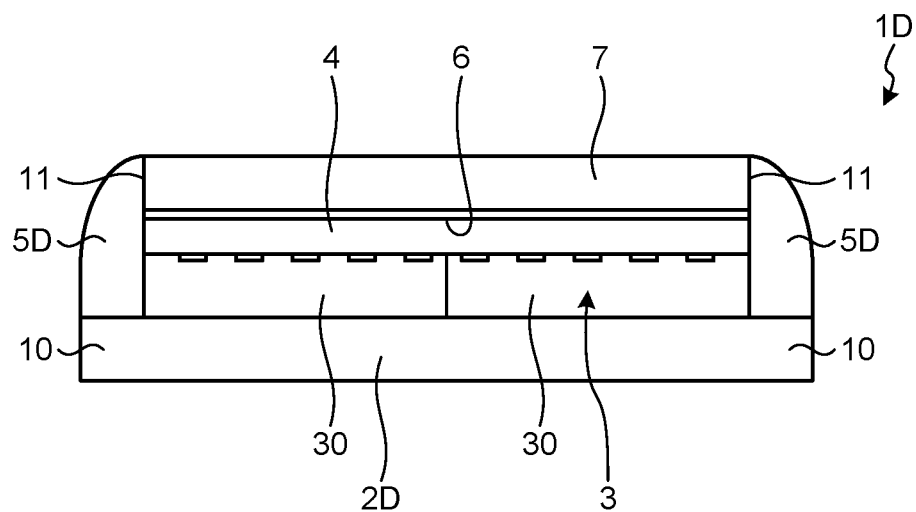
FIG. 10 is a cross-sectional view illustrating a cross-sectional structure of a force sensor according to a fifth embodiment.

FIG. 10 is a cross-sectional view illustrating a cross-sectional structure of a force sensor according to a fifth embodiment. As illustrated in FIG. 10, in a force sensor 1D in the fifth embodiment, the array layer 3, the conductive layer 4, and the protection layer 7 have the same shape when viewed from the layering direction. The force sensor 1D, thus, has an outer peripheral surface 11 that is composed of the side surfaces of the array layer 3, the conductive layer 4, and the protection layer 7, the three side surfaces being continuous. A bonding member 2D in the fifth embodiment protrudes on the outside of the outer peripheral surface 11 (the array layer 3, the conductive layer 4, and the protection layer 7) when viewed from the layering direction. A sealing portion 5D is formed by hardening a resin. The sealing portion 5D is fixed to and across the outer peripheral surface 11 and an end portion 10 of the bonding member 2D. This structure can prevent liquid from entering between the array layer 3 and the conductive layer 4 and/or between the conductive layer 4 and the counter electrode 6 from the side of the force sensor 1D since the sealing portion 5D covers the outer peripheral surface 11.

Sixth Embodiment

Figure 11:
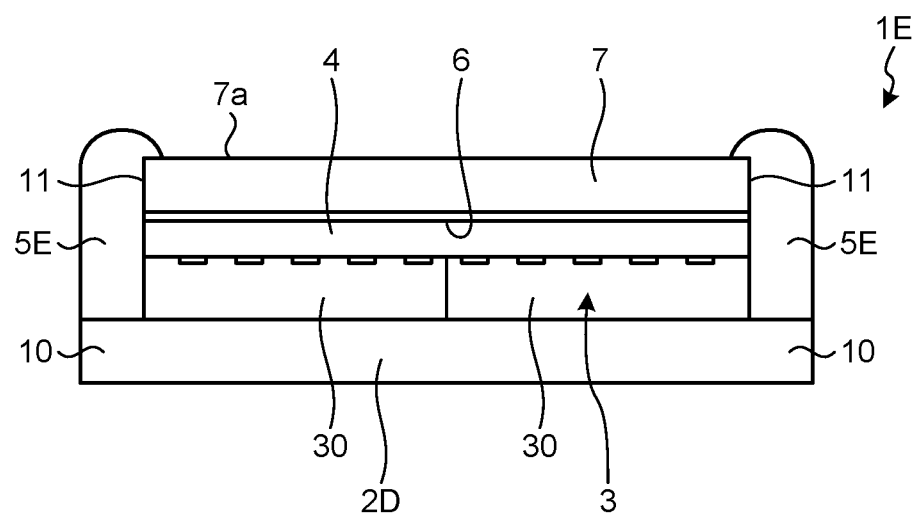
FIG. 11 is a cross-sectional view illustrating a cross-sectional structure of a force sensor according to a sixth embodiment.

FIG. 11 is a cross-sectional view illustrating a cross-sectional structure of a force sensor according to a sixth embodiment. As illustrated in FIG. 11, a sealing portion 5E of a force sensor 1E according to the sixth embodiment is fixed to and across the end portion 10 of the bonding member 2D, the outer peripheral surface 11, and the edge of the first surface 7a of the protection layer 7. This structure results in the fixing area of the sealing portion 5E being larger than that of the sealing portion 5D in the fifth embodiment, thereby making it difficult for the sealing portion 5E to be peeled.

Seventh Embodiment

Figure 12:
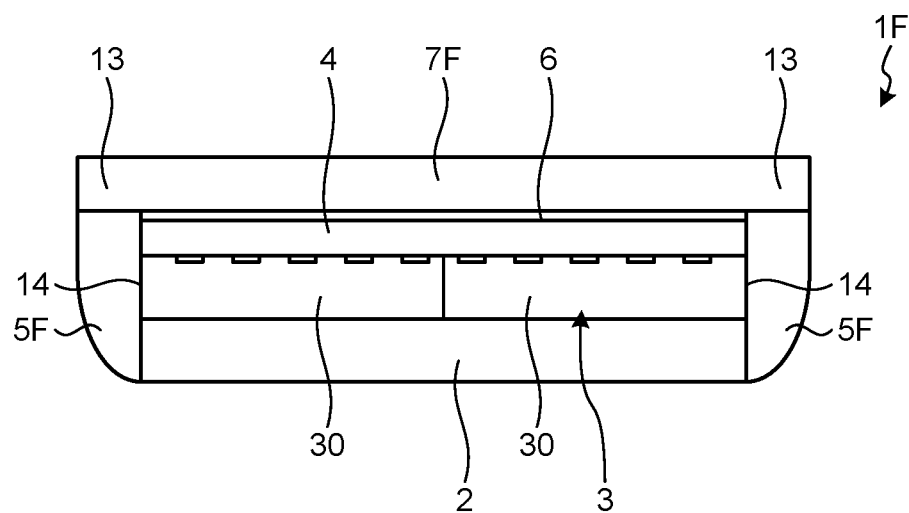
FIG. 12 is a cross-sectional view illustrating a cross-sectional structure of a force sensor according to a seventh embodiment.

FIG. 12 is a cross-sectional view illustrating a cross-sectional structure of a force sensor according to a seventh embodiment. As illustrated in FIG. 12, in a force sensor 1F according to the seventh embodiment, the bonding member 2, the array layer 3, and the conductive layer 4 have the same shape when viewed from the layering direction. The force sensor 1F has an outer peripheral surface 14 that is composed of the side surfaces of the bonding member 2, the array layer 3, and the conductive layer 4, the three side surfaces being continuous. A protection layer 7F protrudes on the outside of the outer peripheral surface 14 (the bonding member 2, the array layer 3, and the conductive layer 4) when viewed from the layering direction. A sealing portion 5F is fixed to and across the outer peripheral surface 14 and an end portion 13 of the protection layer 7. This structure, thus, makes it difficult for liquid to enter between the array layer 3 and the conductive layer 4 and/or between the conductive layer 4 and the counter electrode 6 from the side of the force sensor 1F since the sealing portion 5F covers the outer peripheral surface 14.

Eighth Embodiment

Figure 13:
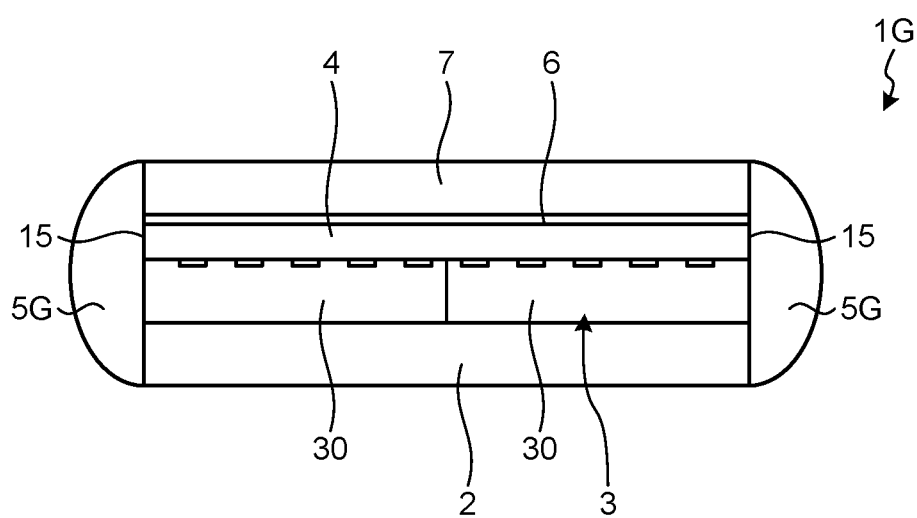
FIG. 13 is a cross-sectional view illustrating a cross-sectional structure of a force sensor according to an eighth embodiment.

FIG. 13 is a cross-sectional view illustrating a cross-sectional structure of a force sensor according to an eighth embodiment. As illustrated in FIG. 13, in a force sensor 1G according to the eighth embodiment, the bonding member 2, the array layer 3, the conductive layer 4, and the protection layer 7 have the same shape when viewed from the layering direction. The force sensor 1G has an outer peripheral surface 15 that is composed of the side surfaces of the bonding member 2, the array layer 3, the conductive layer 4, and the protection layer 7, the four side surfaces being continuous.

A sealing portion 5G is applied to the outer peripheral surface 15 and hardened. This structure can prevent liquid from entering between the array layer 3 and the conductive layer 4 and/or between the conductive layer 4 and the counter electrode 6 from the side of the force sensor 1G since the sealing portion 5G covers the outer peripheral surface 15.

The sealing portions described above are formed by hardening a resin. The sealing portion of the force sensor in the present disclosure is not limited to those formed by hardening a resin as long as the sealing portion can prevent entering of liquid. The following describes examples using sealing members.

Ninth Embodiment

Figure 14:
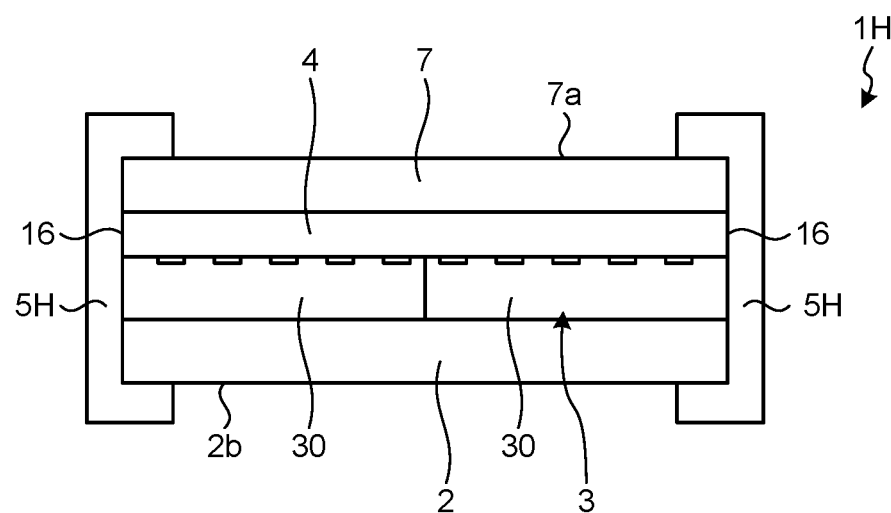
FIG. 14 is a cross-sectional view illustrating a cross-sectional structure of a force sensor according to a ninth embodiment.

FIG. 14 is a cross-sectional view illustrating a cross-sectional structure of a force sensor according to a ninth embodiment. As illustrated in FIG. 14, in a force sensor 1H according to the ninth embodiment, the bonding member 2, the array layer 3, the conductive layer 4, and the protection layer 7 have the same shape when viewed from the layering direction. The force sensor 1H has an outer peripheral surface 16 that is composed of the side surfaces of the bonding member 2, the array layer 3, the conductive layer 4, and the protection layer 7, the four side surfaces being continuous. A sealing portion 5H is a sealing member that has a film shape and has an adhesive layer on only one surface thereof. The sealing portion 5H is adhesively bonded to and across the outer peripheral surface 16, the end portion of the first surface 7a of the protection layer 7, and the end portion of a second surface 2b of the bonding member 2. This structure can prevent liquid from entering between the array layer 3 and the conductive layer 4 and/or between the conductive layer 4 and the counter electrode 6 from the side of the force sensor 1H.

Tenth Embodiment

Figure 15:
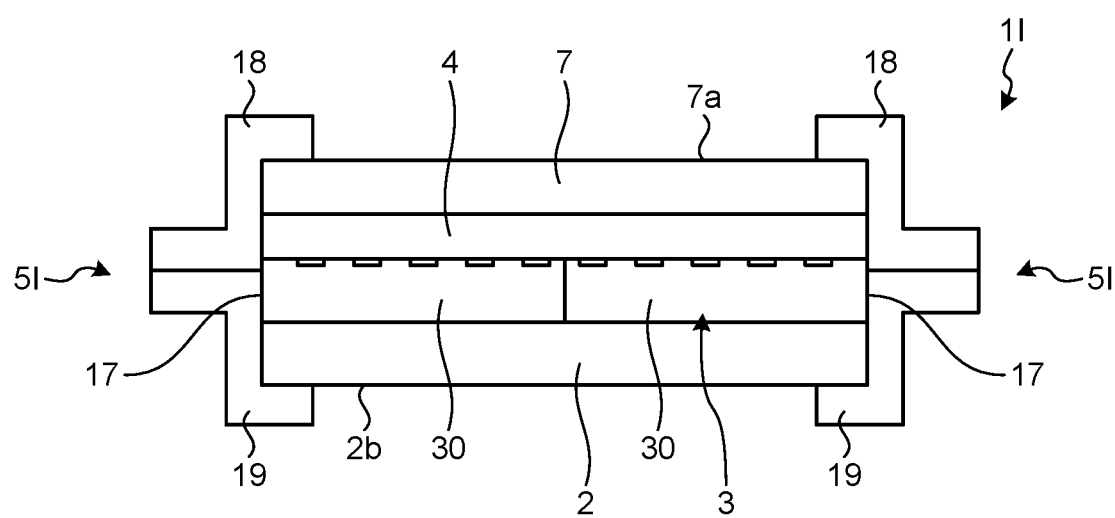
FIG. 15 is a cross-sectional view illustrating a cross-sectional structure of a force sensor according to a tenth embodiment.

FIG. 15 is a cross-sectional view illustrating a cross-sectional structure of a force sensor according to a tenth embodiment. A force sensor 1I according to the tenth embodiment differs from the force sensor 1H according to the ninth embodiment in that a sealing portion 5I is used instead of the sealing portion 5H. The sealing portion 5I includes a first sealing member 18 and a second sealing member 19 that is disposed on the second direction X2 side of the first sealing member 18. The first sealing member 18 covers the surface from the center to the first direction X1 side of an outer peripheral surface 17 in the layering direction. The second sealing member 19 covers the surface from the center to the second direction X2 side of the outer peripheral surface 17 in the layering direction. The first sealing member 18 is adhesively bonded to the end portion of the first surface 7a of the protection layer. The second sealing member 19 is adhesively bonded to the end portion of the second surface 2b of the bonding member 2. The end portion in the second direction X2 of the first sealing member 18 and the end portion in the first direction X1 of the second sealing member 19 are adhesively bonded. The force sensor 1I thus structured can prevent liquid from entering between the array layer 3 and the conductive layer 4 and/or between the conductive layer 4 and the counter electrode 6 from the side of the force sensor 1I.

The conductive layer 4 is described as a resistance change type that changes a resistance value in accordance with a change in thickness caused by being depressed in the first to the tenth embodiments. The conductive layer of the force sensor in the present disclosure may be a capacitance change type that changes capacitance formed between the array electrodes and the counter electrode in accordance with a change in thickness in the layering direction (thickness direction). The conductive layer 4 of such a capacitance change type is manufactured of rubber or a polymer compound that can be elastically deformed and has an insulation property. When the conductive layer of the capacitance change type is used, the double-sided adhesive tape and the adhesive layer that are interposed between the conductive layer and the array electrodes and between the conductive layer and the counter electrode may have no conductivity. The following describes a force sensor that uses the conductive layer of the capacitance change type and makes it hard for liquid and foreign particles to stick to the array electrodes 31.

Eleventh Embodiment

Figure 16:
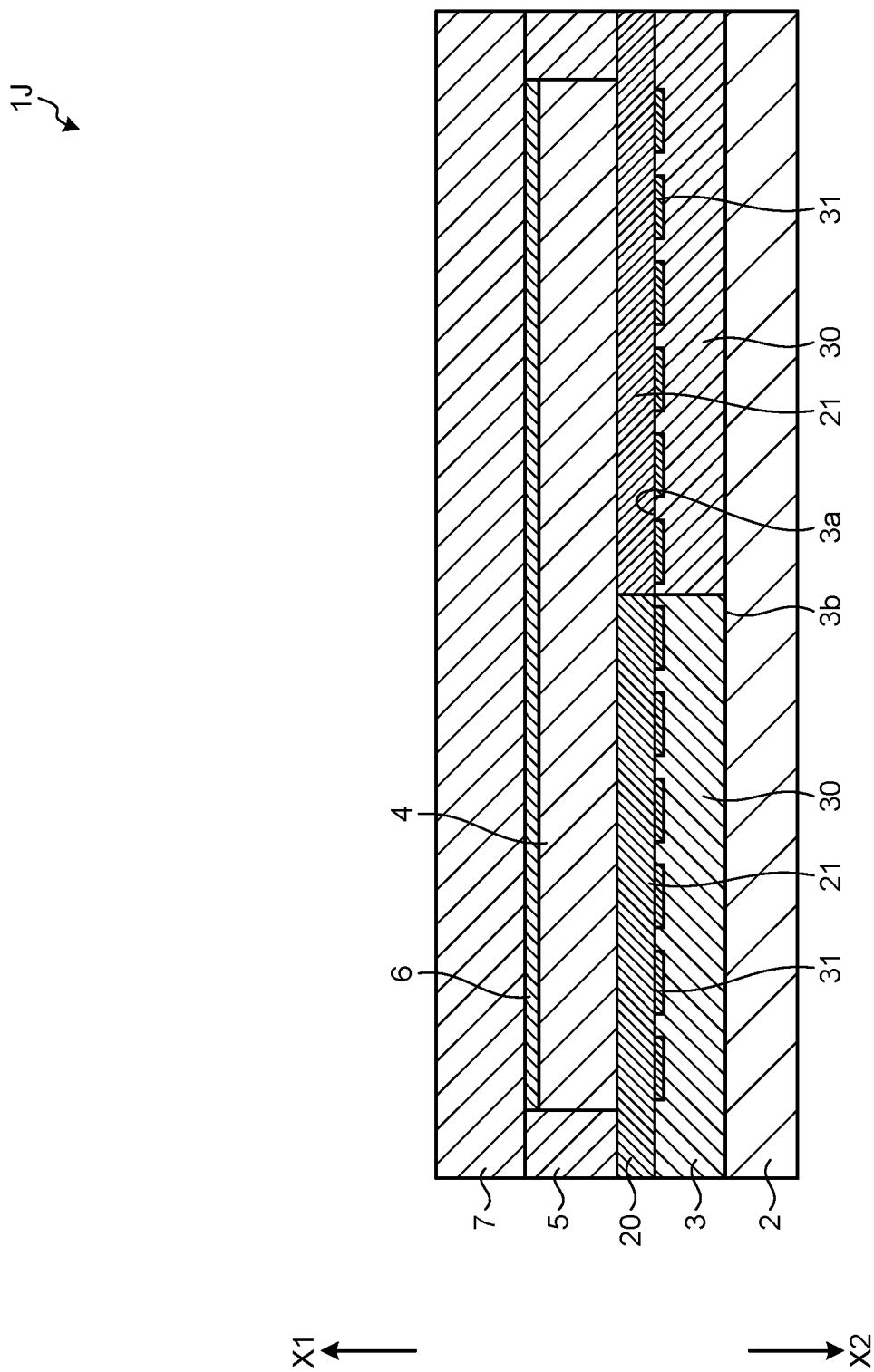
FIG. 16 is a cross-sectional view illustrating a cross-sectional structure of a force sensor according to an eleventh embodiment.

FIG. 16 is a cross-sectional view illustrating a cross-sectional structure of a force sensor according to an eleventh embodiment. As illustrated in FIG. 16, a force sensor 1J according to the eleventh embodiment differs from the force sensor 1 according to the first embodiment in that a first sealing film 20 is provided on the first surface 3a of the array layer 3. The first sealing film 20 is composed of combination of four small piece protection films 21 that are formed on the first surface of the array substrate 30. The first sealing film 20 (the small piece protection films 21) is an insulation material such as SiOx, SiNx, polyamide, or an acrylic resin. In the eleventh embodiment, the small piece protection films 21 are manufactured by a physical vapor deposition (PVD) method or a chemical vapor deposition (CVD) method so as to be integrated with the array substrate 30, for example. The conductive layer 4 is adhesively bonded to the first sealing film 20 with a double-sided adhesive tape or a resin.

In the force sensor 1J according to the eleventh embodiment, each array electrode 31 is covered by the first sealing film 20. This structure, thus, can prevent liquid or foreign particles from sticking to the array electrodes 31. The thickness of the first sealing film 20 can be reduced, thereby making it possible to downsize the force sensor 1J. In addition, the structure can prevent crosstalk and corrosion of the array electrodes 31.

Twelfth Embodiment

Figure 17:
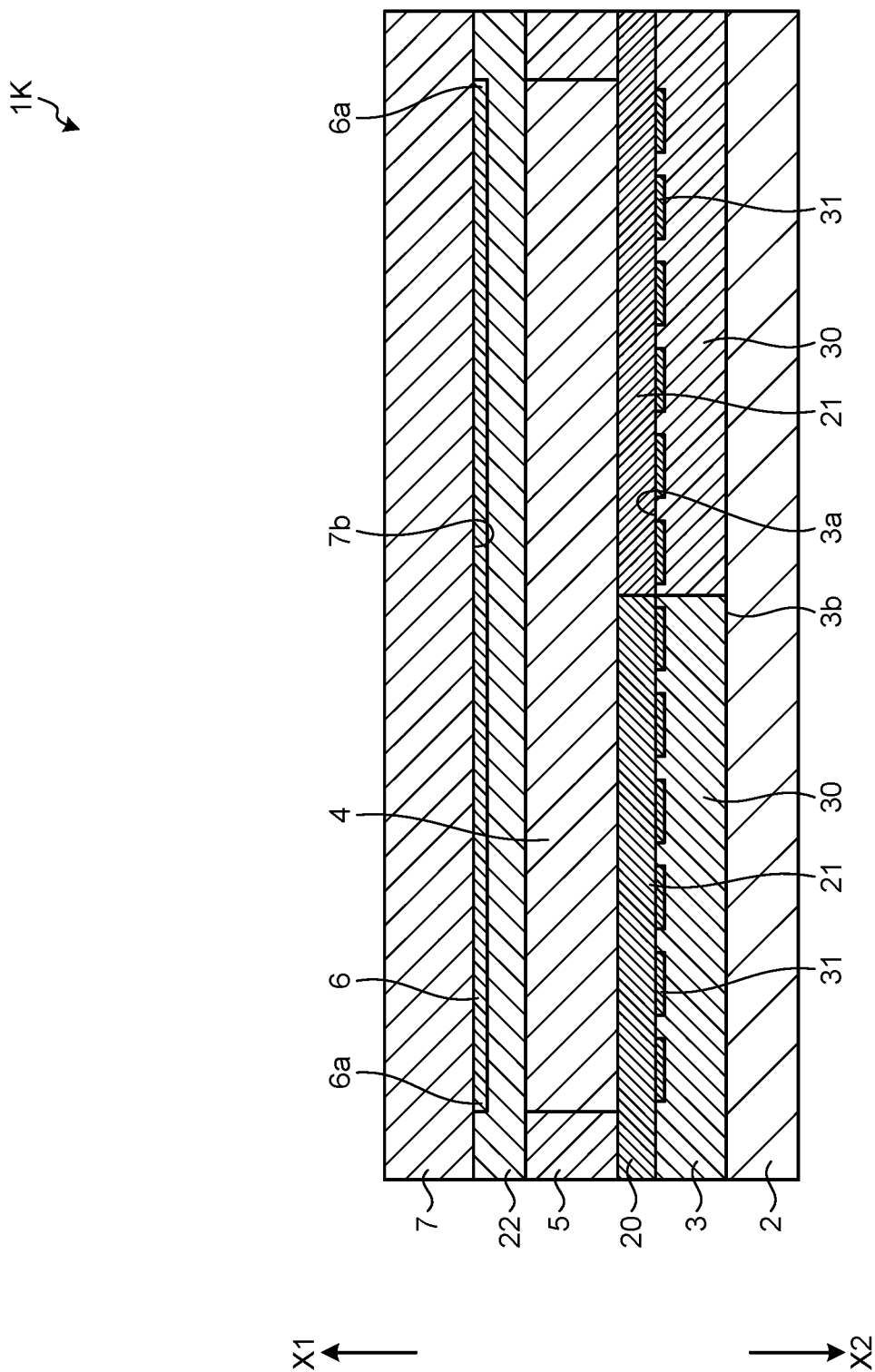
FIG. 17 is a cross-sectional view illustrating a cross-sectional structure of a force sensor according to a twelfth embodiment.

FIG. 17 is a cross-sectional view illustrating a cross-sectional structure of a force sensor according to a twelfth embodiment. As illustrated in FIG. 17, a force sensor 1K according to the twelfth embodiment differs from the force sensor 1J according to the eleventh embodiment in that a second sealing film 22 is provided on the second direction X2 side of the counter electrode 6. The second sealing film 22 extends on the outside of an end portion 6a of the counter electrode 6. The second sealing film 22 covers the counter electrode 6 and the end portion of the second surface 7b of the protection layer 7. This structure can prevent corrosion of the counter electrode 6. The second sealing film 22 is manufactured by being printed to overlap with the counter electrode 6 after the counter electrode 6 is printed on the second surface 7b of the protection layer 7.

Thirteenth Embodiment

Figure 18:
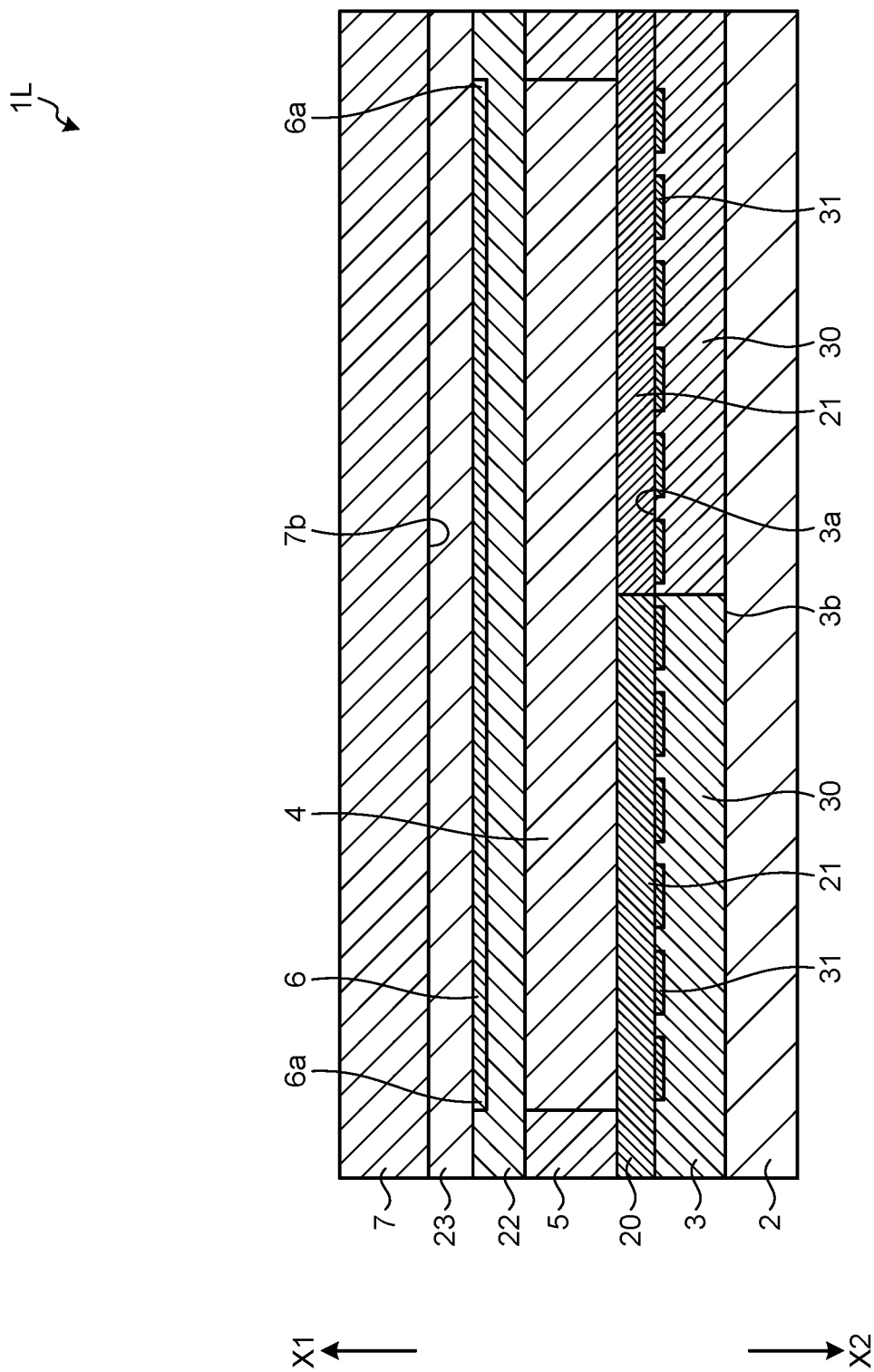
FIG. 18 is a cross-sectional view illustrating a cross-sectional structure of a force sensor according to a thirteenth embodiment.

FIG. 18 is a cross-sectional view illustrating a cross-sectional structure of a force sensor according to a thirteenth embodiment. As illustrated in FIG. 18, a force sensor 1L according to the thirteenth embodiment differs from the force sensor 1K according to the twelfth embodiment in that a third sealing film 23 is provided on the first direction X1 side of the counter electrode 6. The third sealing film 23 is formed on the second surface 7b of the protection layer 7 entirely. The third sealing film 23 and the second sealing film 22 sandwich the counter electrode 6. The outer peripheral portions of the third sealing film 23 and the second sealing film 22 are in contact with each other, resulting in the end portion 6a of the counter electrode 6 not being exposed. This structure further prevents the corrosion of the counter electrode 6. In a manufacturing sequence, first, the third sealing film 23 is printed on the second surface 7b of the protection layer 7, and then the counter electrode 6, and thereafter the second sealing film 22 are printed.

The bonding member 2 is not limited to having a film shape or a sheet shape as described in the embodiments described above. For example, a resin is applied to the joints between the array substrates 30 from the second direction X2, and the resin is hardened to be formed as a resin portion serving as the bonding member 2. Such a resin portion can bond the array substrates 30 and can prevent liquid from entering between the array substrates 30.

What is claimed is:

1. A force sensor comprising:
an array layer that includes multiple array substrates arranged on an identical plane such that end portions of the array substrates are adjacent to each other, the array layer including a first surface on which array electrodes are disposed and a second surface opposite to the first surface;
a conductive layer that is layered on the first surface of the array layer; a
protection layer that is layered on the conductive layer; and
a counter electrode that is interposed between the conductive layer and the protection layer,
wherein
a bonding member which bonds the adjacent array substrates and covers a joint between the adjacent array substrates is provided on the second surface of the array layer, the conductive layer is composed of a single member that is layered across each of the array substrates;
the array substrates including the array electrodes and further including thin film transistors each connected to a corresponding one of the array electrodes, and
a sealing portion that has a frame shape is provided on an outer circumference side of the conductive layer.

2. The force sensor according to claim 1, wherein the bonding member is a single protection film that covers the second surface of the array layer entirely, and is adhesively bonded to each of the array substrates.

3. The force sensor according to claim 1, wherein the sealing portion is interposed between the array layer and the protection layer.

4. The force sensor according to claim 1, comprising an outer peripheral surface that includes
a side surface of the array layer,
a side surface of the conductive layer, and
a side surface of the protection layer, all of the side surfaces being continuous to constitute the outer peripheral surface,
wherein the sealing portion covers the outer peripheral surface.

5. The force sensor according to claim 1, wherein
the conductive layer is a capacitance change type that changes capacitance in accordance with a change in thickness, and
a first sealing film is provided between the array layer and the conductive layer and covers the array electrodes.

6. The force sensor according to claim 5, comprising a second sealing film that is disposed between the conductive layer and the protection layer and covers the counter electrode.

7. The force sensor according to claim 6, comprising a third sealing film that is disposed between the counter electrode and the protection layer.

8. The force sensor according to claim 1, wherein
the multiple array substrates are overlapped by the conductive layer composed of the single member, a single protection layer, a single counter electrode, and a single bonding member.

9. The force sensor according to claim 1, wherein the multiple array substrates, the conductive layer composed of the single member, a single counter electrode, and a single protection layer are stacked sequentially on a single bonding member.

* * * * *